US008937392B2

(12) United States Patent
Hirose et al.

(10) Patent No.: US 8,937,392 B2
(45) Date of Patent: Jan. 20, 2015

(54) SEMICONDUCTOR DEVICE

(71) Applicant: PS4 Luxco S.a.r.l., Luxembourg (LU)

(72) Inventors: Yukitoshi Hirose, Tokyo (JP); Yushi Inoue, Tokyo (JP); Shiro Harashima, Tokyo (JP); Takuya Moriya, Tokyo (JP); Chihoko Yokobe, Tokyo (JP)

(73) Assignee: PS4Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/709,901

(22) Filed: Dec. 10, 2012

(65) Prior Publication Data

US 2013/0147042 A1 Jun. 13, 2013

(30) Foreign Application Priority Data

Dec. 13, 2011 (JP) ................................ 2011-272091

(51) Int. Cl.
*H01L 23/48* (2006.01)
*H01L 23/488* (2006.01)
(Continued)

(52) U.S. Cl.
CPC ........ *H01L 23/488* (2013.01); *H01L 23/49816* (2013.01); *H01L 23/49838* (2013.01); *H01L 21/561* (2013.01); *H01L 25/105* (2013.01); *H01L 24/97* (2013.01); *H01L 25/0657* (2013.01); *H01L 23/5384* (2013.01); *H01L 23/552* (2013.01); *H01L 2224/16225* (2013.01); *H01L 2224/32225* (2013.01); *H01L 2224/32245* (2013.01); *H01L 2224/48227* (2013.01); *H01L 2224/48465* (2013.01); *H01L 2224/49171* (2013.01); *H01L 2224/73204* (2013.01); *H01L 2224/73265* (2013.01); *H01L 2924/15311* (2013.01); *H01L 23/3128* (2013.01); *H01L 2224/97* (2013.01); *H01L 2225/0651* (2013.01); *H01L 2225/1023* (2013.01); *H01L 2225/1058* (2013.01); *H01L 2924/15331* (2013.01); *H01L 2225/06562* (2013.01); *H01L 2224/32145* (2013.01); *H01L 2224/48091* (2013.01);
(Continued)

(58) Field of Classification Search
None
See application file for complete search history.

(56) References Cited

U.S. PATENT DOCUMENTS 7,501,709 B1 * 3/2009 Hool et al. .................... 257/784
8,159,058 B2 4/2012 Ishikawa et al.

FOREIGN PATENT DOCUMENTS

JP 2009-70965 A 4/2009

*Primary Examiner* — David Vu
*Assistant Examiner* — Cuong B Nguyen
(74) *Attorney, Agent, or Firm* — Foley & Lardner LLP

(57) ABSTRACT

A semiconductor device includes an insulating substrate including a first surface and an opposing second surface, and a semiconductor chip. The semiconductor chip is mounted over the first surface, includes signal electrodes, power-supply electrodes and ground electrodes, which connect to pads on the first surface of the insulating substrate. Lands provided on the second surface of the insulating substrate include signal lands, power-supply lands and ground lands through vias penetrate from the first surface to the second surface of the insulating substrate, and include signal vias electrically connected the signal connection pads to the signal lands, power-supply vias electrically connected the power-supply connection pads to the power-supply lands and ground vias electrically connected the ground connection pads to the ground lands. At least one of the signal vias are closer to the connection pads than immediately adjacent one of the power-supply vias or the ground vias.

18 Claims, 12 Drawing Sheets

CONNECTION PAD (POWER SUPPLY) 402
THROUGH VIA
WIRING BOARD (ONE SURFACE) 400
SOLID PATTERN (GND) 407
SOLID PATTERN (POWER SUPPLY) 408
WIRING (SIGNAL) 401
THROUGH VIA 403

SOLID PATTERN (GND) 407
THROUGH VIA
WIRING BOARD (THE OTHER SURFACE) 400
LAND (POWER SUPPLY) 404
LAND (SIGNAL) 405
LAND (GND) 406
WIRING (SIGNAL) 401
SOLID PATTERN (POWER SUPPLY) 408

(51) Int. Cl.

| | |
|---|---|
| ***H01L 23/498*** | (2006.01) |
| ***H01L 21/56*** | (2006.01) |
| ***H01L 25/10*** | (2006.01) |
| ***H01L 23/00*** | (2006.01) |
| ***H01L 25/065*** | (2006.01) |
| *H01L 23/538* | (2006.01) |
| *H01L 23/552* | (2006.01) |
| *H01L 23/31* | (2006.01) |

(52) U.S. Cl.

CPC ................. *H01L24/45* (2013.01); *H01L 24/48* (2013.01); *H01L 2224/45144* (2013.01); *H01L 2224/48228* (2013.01); *H01L 2224/85203* (2013.01); *H01L 2224/85205* (2013.01); *H01L 24/16* (2013.01); *H01L 24/32* (2013.01); *H01L 2924/15182* (2013.01); *H01L 2924/12041* (2013.01); *H01L 2924/30107* (2013.01); *H01L 2924/3025* (2013.01)

USPC ........... 257/784; 257/668; 257/686; 257/698; 257/734; 257/772; 257/779; 257/781; 257/782; 257/783; 257/786; 438/25; 438/26; 438/106; 438/455; 361/719; 361/720; 361/722; 361/760

FIG. 6A
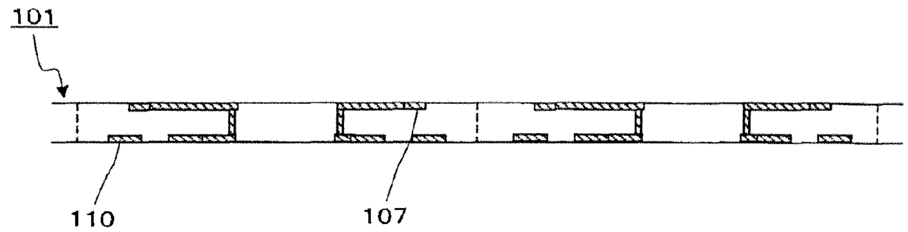
FIG. 6B
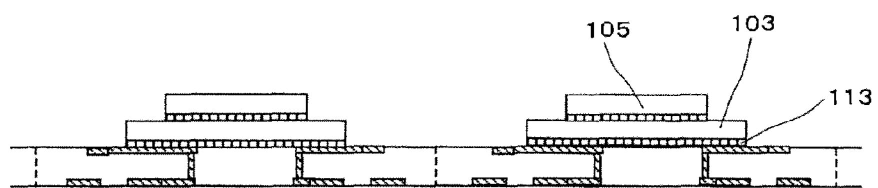
FIG. 6C
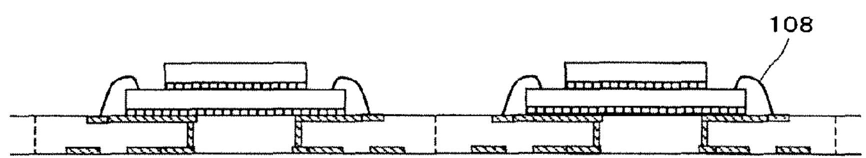
FIG. 6D
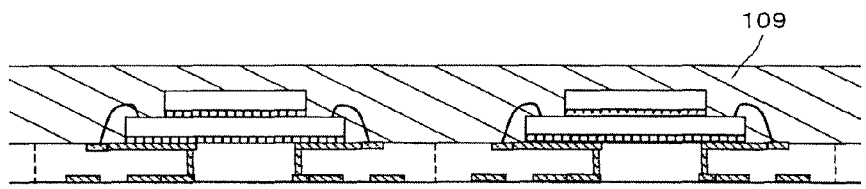
FIG. 6E
FIG. 6F
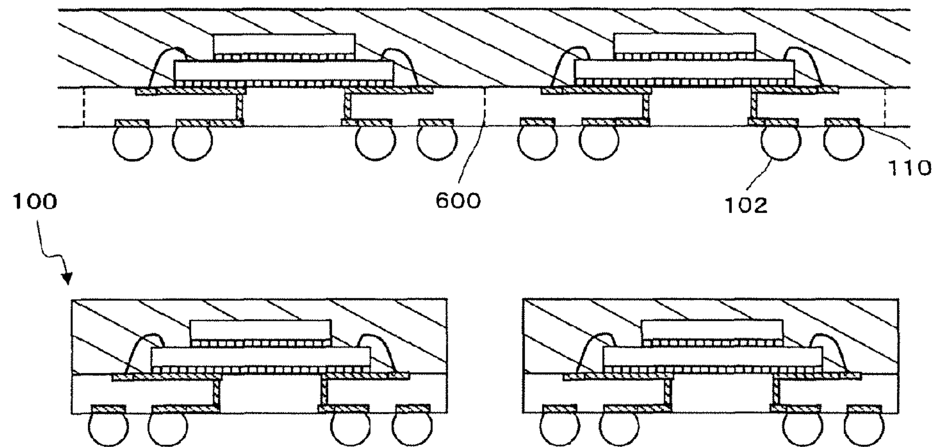

SEMICONDUCTOR DEVICE

This application is based upon and claims the benefit of priority from Japanese patent application No. 2011-272091, filed on Dec. 13, 2011, the disclosure of which is incorporated herein in its entirety by reference.

TECHNICAL FIELD

This invention relates to a semiconductor device.

BACKGROUND

Recently, there are semiconductor devices having a package-on-package (PoP) structure in which a plurality of semiconductor packages are stacked one on another.

A technical literature relating to this is exemplified by Japanese Laid-Open Patent Publication No. 2009-70965 (Patent Document 1), which discloses such a semiconductor device having a PoP structure.

When controller and memory packages are stacked in this PoP structure, in general, the lower package is constituted by a controller chip, while the upper package is constituted by a memory chip. The upper package is connected to the lower package at the periphery of the lower package board, and hence external terminals (bump electrodes) are arranged only on the periphery of the upper package board.

However, in the upper package having the external terminals arranged only on the periphery, it is difficult to establish linear connection from a bonding pad to a land in an area where bonding pads of the wiring board are arranged closely to each other (dense wiring area).

Therefore, a wire is led from a bonding pad on one surface of the wiring board toward a central part thereof, then led to the other surface of the wiring board through a through via, and connected to a land arranged on the periphery of the other surface. As a result, the wiring length of the wiring on the wiring board is increased.

SUMMARY

In one embodiment, there is provided a semiconductor device comprising:

an insulating substrate including a first surface and a second surface opposite to the first surface;

a semiconductor chip including a plurality of first electrodes thereon, the semiconductor chip being mounted over the first surface of the insulating substrate, the first electrodes including signal electrodes, power-supply electrodes and ground electrodes;

a plurality of connection pads provided on the first surface of the insulating substrate, the connection pads including signal connection pads electrically connected to the signal electrodes, power-supply connection pads electrically connected to the power-supply electrodes and ground connection pads electrically connected to the ground electrodes;

a plurality of lands provided on the second surface of the insulating substrate, the lands including signal lands, power-supply lands and ground lands; and a plurality of through vias penetrated from the first surface to the second surface of the insulating substrate, the through vias including signal vias electrically connected the signal connection pads to the signal lands, power-supply vias electrically connected the power-supply connection pads to the power-supply lands and ground vias electrically connected the ground connection pads to the ground lands, at least one of the signal vias being closer to the connection pads than immediately adjacent one of the power-supply vias or the ground vias.

In another embodiment, there is provided a semiconductor device comprising:

a wiring board including a first surface, a second surface opposite to the first surface, and wiring patterns, each of the wiring patterns comprises a connection pad formed on the first surface, a land formed on the second surface, a through via formed in the wiring board, a first wiring electrically connected the connection pad to the through via and a second wiring electrically connected the land to the through via; and a semiconductor chip mounted over the first surface of the wiring board, the semiconductor chip including a plurality of electrodes thereon, the electrodes being electrically connected to the connection pads of the wiring patterns, and the electrodes including signal electrodes, power-supply electrodes and ground electrodes, wherein the wiring patterns include signal wiring patterns electrically connected to the signal electrodes, power-supply wiring patterns electrically connected to the power-supply electrodes and ground wiring patterns electrically connected to the ground electrodes, and at least one of the signal wiring patterns is shorter than immediately adjacent one of the power-supply wiring patterns or the ground wiring patterns.

In the other embodiment, there is provided a semiconductor device comprising:

a wiring board defined by a first major surface, a second major surface facing the first major surface, and a plurality of side surfaces;

a semiconductor chip mounted on the first major surface, having a side surface facing one side surface of the plurality of side surfaces, and having a plurality of electrodes arranged along the faced side surface;

a plurality of connection pads provided on the first major surface of the wiring board between the one side surface of the wiring board and the faced side surface of the semiconductor chip and electrically connected to the plurality of electrodes of the semiconductor chip;

a plurality of external terminals provided on the second major surface of the wiring board, along and close to the one side surface of the wiring board;

a plurality of first through vias formed in the wiring board to penetrate from the first major surface to the second major surface in positions overlapping with the semiconductor chip;

a plurality of first wirings formed on the first major surface of the wiring board to electrically connect the first connection pads to the first through vias; and a plurality of second wirings formed on the second major surface to electrically connect the external terminals to the first through vias, wherein:

the electrodes include signal electrodes and power-supply and ground electrodes, the first through vias include a plurality of signal through vias electrically connected to the signal electrodes, and a plurality of power-supply and ground through vias electrically connected to the power-supply and ground electrodes, and, the signal through vias are arranged at positions closer to at least the one side surface than the power-supply and ground through vias adjacent to the respective signal through vias.

BRIEF DESCRIPTION OF THE DRAWINGS

The above features and advantages of the present invention will be more apparent from the following description of certain preferred embodiments taken in conjunction with the accompanying drawings, in which

FIG. 6A is a cross-sectional view showing an assembly flow of the semiconductor device according to the first embodiment of the invention;

FIG. 6B is a cross-sectional view showing the assembly flow of the semiconductor device according to the first embodiment of the invention;

FIG. 6C is a cross-sectional view showing the assembly flow of the semiconductor device according to the first embodiment of the invention;

FIG. 6D is a cross-sectional view showing the assembly flow of the semiconductor device according to the first embodiment of the invention;

FIG. 6E is a cross-sectional view showing the assembly flow of the semiconductor device according to the first embodiment of the invention;

FIG. 6F is a cross-sectional view showing the assembly flow of the semiconductor device according to the first embodiment of the invention;

DESCRIPTION OF EXEMPLARY EMBODIMENTS

The present invention will be now described herein with reference to illustrative exemplary embodiments. Those skilled in the art will recognize that many alternative embodiments can be accomplished using the teachings of the present invention and that the invention is not limited to the exemplary embodiments illustrated for explanatory purposes.

Exemplary embodiments of the invention will be described in detail with reference to the drawings.

Figure 1:
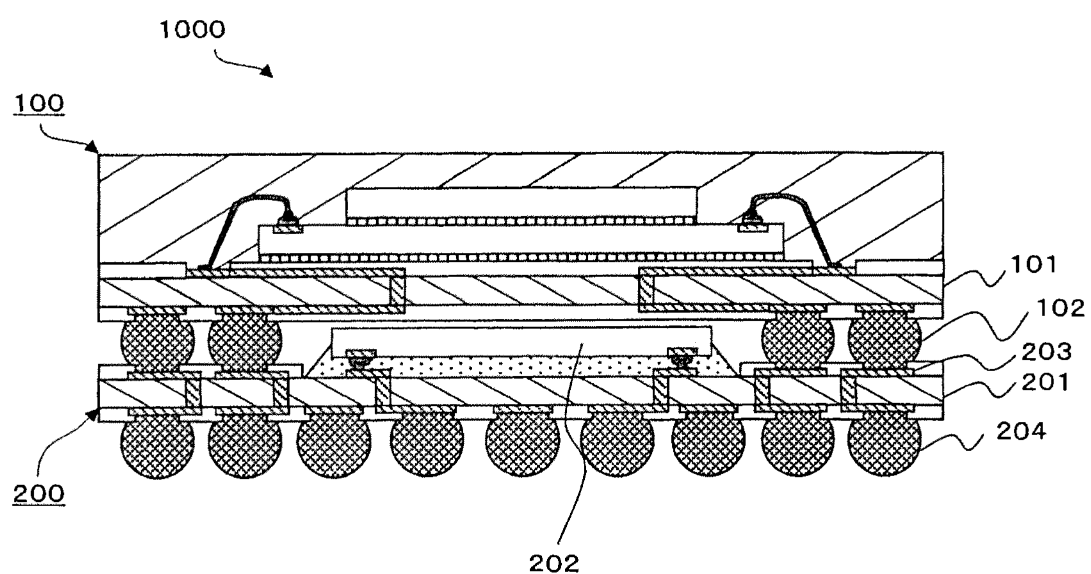
FIG. 1 is a cross-sectional view showing a configuration of a semiconductor device having a PoP structure according to a first embodiment of the invention.

FIG. 1 is a cross-sectional view showing a configuration of a semiconductor device having a package-on-package (PoP) structure.

A semiconductor device 1000 of a PoP structure has an upper package (memory package) 100 and a lower package (controller package) 200.

In the lower package 200, a controller chip 202 is flip-chip mounted on a wiring board 201, and lands 203 are arranged around the controller chip 202 on one surface of the wiring board 201 so that the lower package 200 is connected to the upper package 100 through these lands 203. Solder balls 204 are provided on the other surface of the wiring board 201. The upper package 100 is stacked and mounted on the upper side of the lower package 200.

In the upper package 100, solder balls 102 serving as external terminals are arranged in two rows along the periphery of the other surface of the wiring board 101 such that they will not come into contact with the controller chip 202 of the lower package 200.

Figure 2:
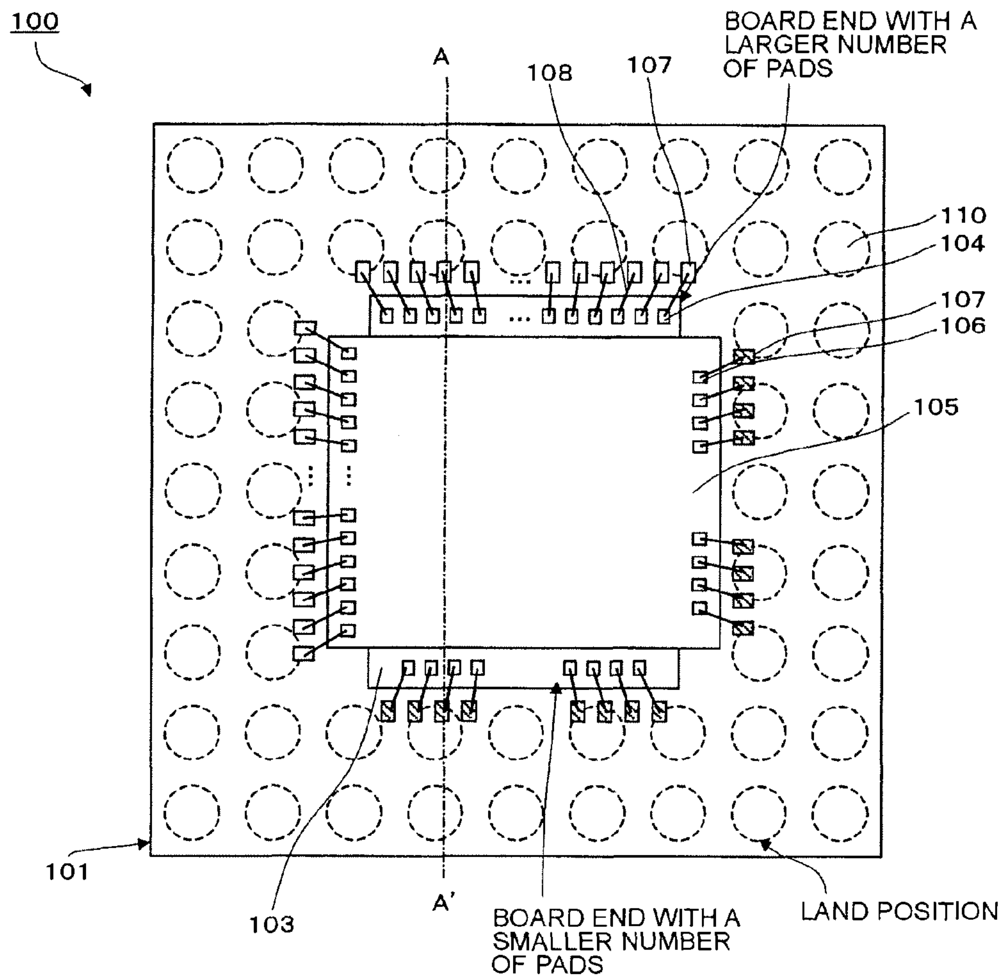
FIG. 2 is a plan view showing a schematic configuration of an upper package (memory package) that is the semiconductor device according to the first embodiment of the invention.
Figure 3:
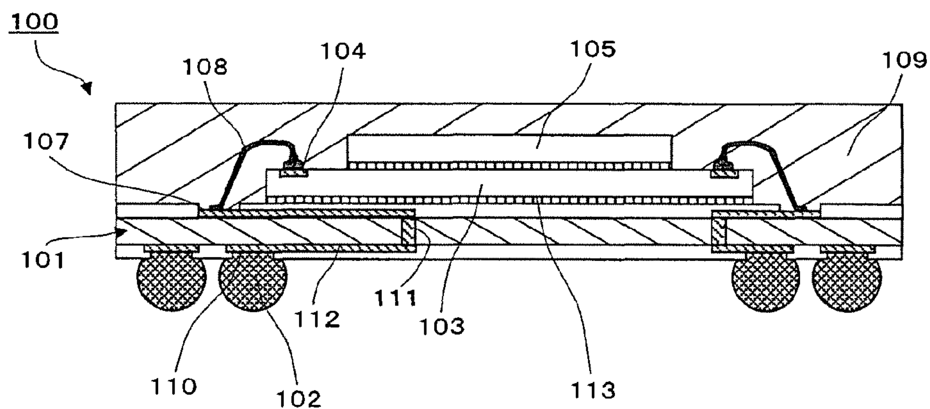
FIG. 3 is a cross-sectional view showing a schematic configuration of an upper package (memory package) that is the semiconductor device according to the first embodiment of the invention.

Referring to FIGS. 2 and 3, a configuration of the upper package (memory package) 100 will be described in detail. FIG. 2 is a plan view showing a configuration of the upper package 100, while FIG. 3 is an A-A' cross-sectional view showing the configuration of the upper package 100. Hereinafter, the upper package 100 shall be referred to as the semiconductor device.

As shown in FIGS. 2 and 3, a first semiconductor chip (first memory chip) 103 is mounted in a substantially central part on one surface of the wiring board 101 with its circuit formation surface facing upward, by means of an adhesive member 113. The wiring board 101 may be a glass-epoxy wiring board, for example.

The first semiconductor chip 103 has a substantially rectangular plate shape, for example, and has a plurality of electrode pads 104 arranged on each of its short sides. In the first semiconductor chip 103, more electrode pads 104 are arranged on one of the short sides than on the other short side (see FIG. 2).

A second semiconductor chip (second memory chip) 105 is mounted on top of the first semiconductor chip 103 with its circuit formation surface facing upward. The second semiconductor chip 105 is configured in the same manner as the first semiconductor chip 103. Specifically, the second semiconductor chip 105 has, for example, a substantially rectangular shape, and has a plurality of electrode pads 106 arranged on each of its short sides (see FIG. 2). In the second semiconductor chip 105, more electrode pads 106 are arranged on one of the short sides than on the other short side. The second semiconductor chip 105 is stacked in a position rotated by 90 degrees with respect to the first semiconductor chip 103 such that the electrode pads 104 of the first semiconductor chip 103 are exposed.

A plurality of connection pads 107 are arranged on one surface of the wiring board 101 in correspondence with the electrode pads 104 of the first semiconductor chip 103 and the electrode pads 106 of the second semiconductor chip 105. The electrode pads 104 of the first semiconductor chip 103 and the electrode pads 106 of the second semiconductor chip 105 are connected to the corresponding connection pads 107 by means of electrically conductive wires 108 made of Au or the like.

A sealer (sealing resin) 109 is formed on one surface of the wiring board 101 so as to cover the first semiconductor chip 103, the second semiconductor chip 105 and the wires 108.

A plurality of lands 110 are arranged on the other surface of the wiring board 101, and each of the lands 110 is provided with a solder ball 102. The lands 110 and the connection pads 107 are connected to each other by wirings 112 via through vias 111 formed in the wiring board 101.

Figure 4A:
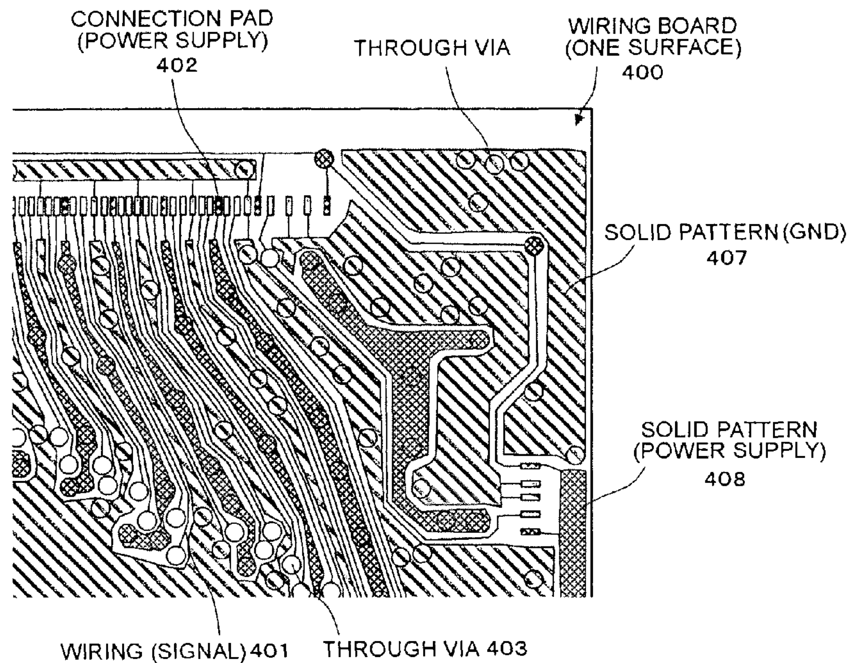
FIG. 4A is a plan view for explaining a reference example of a wiring pattern of a semiconductor device.
Figure 4B:
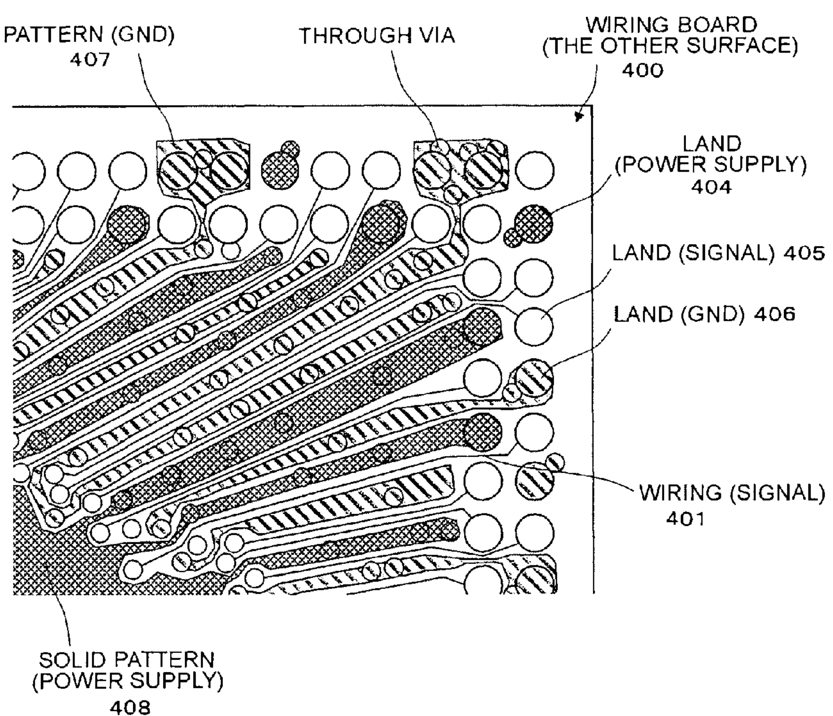
FIG. 4B is a plan view for explaining the reference example of the wiring pattern of the semiconductor device.

Referring to FIGS. 4A and 4B, a reference example of a wiring pattern of a semiconductor device will be described.

In a PoP structure, in general, the wiring length can be made shorter in comparison with a system in which a controller and a memory are arranged side by side on a system board. Therefore, good waveform quality can be ensured without the need of termination. However, the demand for increased operating speed knows no bounds, and today even a package of a PoP structure is required to be designed to further reduce the wiring length.

When designing a package for an operating speed from 400 Mbps to 800-1066 Mbps, as shown in FIGS. 4A and 4B, measures may be taken against noise in a package board by arranging a large number of through vias for a shield line that is used to reduce crosstalk noise between signals and to reduce loop inductance from signal to power supply/GND.

In order to realize the operating speed of 1600 Mbps, improvement in other factors than the package design is necessary, such as improvement of a driver or receiver, reduction of terminal capacity, and the like. However, the package design for realizing reduction of wiring length remains a major problem in realizing the operating speed of 1600 Mbps.

In addition to routing of the shield line, various factors interfere with reduction of wiring length. These factors include, for example, arrangement of power supply and GND, and signals allocated to the package, restrictions to via diameter and via arrangement in production of a package board, and trade-off between reduction of the package size and increase of the semiconductor device's die size for meeting the demand for increased capacity.

As shown in FIGS. 4A and 4B, when a signal wiring 401 is routed in a region of the wiring board 400 where the wiring density is high, the signal wiring 401 is routed from a connection pad 402 toward inside of the wiring board 400 and then turned back toward corresponding one of lands 404 to 406 through a signal through via 403 and connected to this land. In order to reduce the wiring length of the signal wiring 401 routed in this manner, the signal through via 403 must be located as close as possible to the corresponding one of the lands 404 to 406.

However, if many through vias are provided for power-supply and ground wirings 407 and 408, power-supply and ground wirings 407 and 408 will be routed in a wiring width close to the via diameter. In addition, it becomes difficult to ensure an area for arranging through vias 403 for signal wirings at positions close to the lands 404 to 406 due to the presence of the through vias for the power-supply and ground wirings 407*a* and 408, and thus the signal wirings 401 have to be routed to an area where the through vias 403 for the signal wirings can be arranged. As a result the wiring lengths of the signal wirings are increased.

Figure 5A:
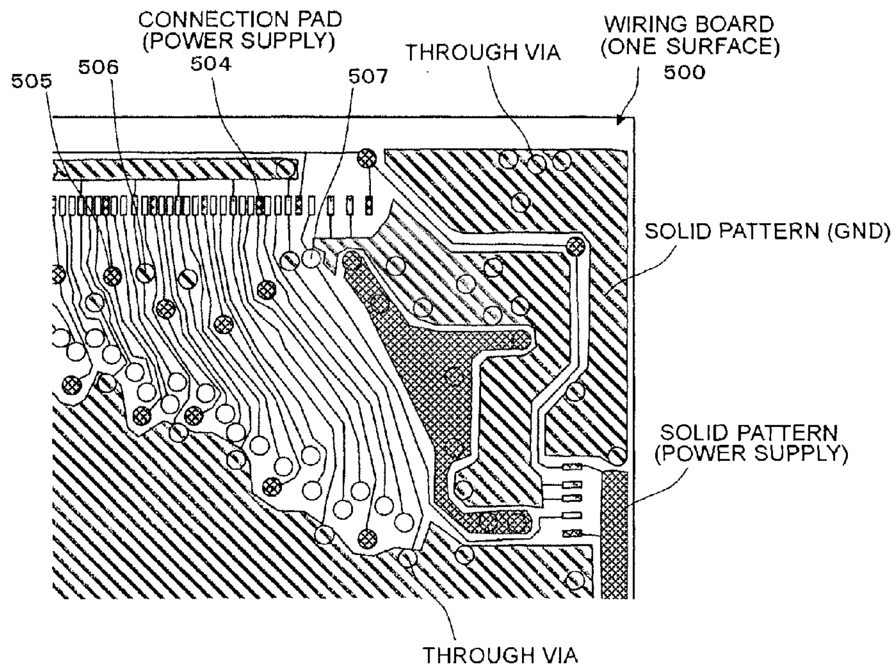
FIG. 5A is a plan view showing a schematic configuration of a wiring pattern of the semiconductor device according to the first embodiment of the invention.
Figure 5B:
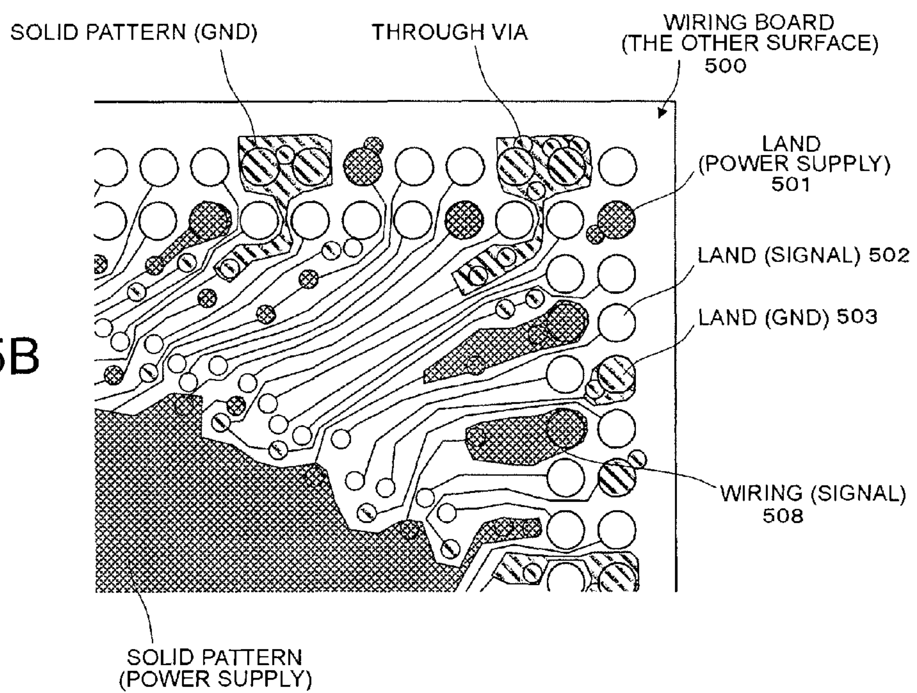
FIG. 5B is a plan view showing a schematic configuration of the wiring pattern of the semiconductor device according to the first embodiment of the invention.

Referring to FIGS. 5A and 5B, a wiring pattern of a semiconductor device 100 according to an exemplary first embodiment of the invention will be described. FIGS. 5A and 5B are plan views showing a schematic configuration of a wiring pattern of the semiconductor device 100 according to the first embodiment.

In order to solve the problems arising in the reference example of the wiring pattern shown in FIGS. 4A and 4B (e.g. increased wiring length of the signal wirings), through vias for a signal wirings are arranged at a position close to corresponding lands, while through vias for power-supply and ground wirings are not arranged closer to the lands than the signal wirings except for those effective to reduce the inductance, so that the widths of the power-supply and ground wirings are not increased. This makes it possible to ensure an area where through vias for signal wirings can be arranged in a region with a high wiring density, and to reduce the wiring lengths of the signal wirings.

Referring to FIGS. 5A and 5B, a wiring pattern of the semiconductor device 100 according to the first embodiment of the invention will be described in detail.

In a wiring board 500 (corresponding to the wiring board 101 of FIG. 2) used in the semiconductor device 100 according to the first embodiment, the density of wiring patterns is high, for example, in a region on the end side where a large number of electrode pads 104 are arranged in the first semiconductor chip 103 that is a memory chip (see FIG. 2).

In this region with a high density of wiring patterns, as shown in FIGS. 5A and 5B, for example, the inductance depends on a distance from the lands 501 to 503 to the connection pads 504. Therefore, the power-supply and ground wirings are such that only the through vias 505 and 506 located close to the connection pad 504 are left while they are arranged at positions further away from the connection pads 504 than the signal through vias 507.

Further, in a region with a high density of wiring patterns, the power-supply and ground wirings are not formed in a solid pattern but formed to have the same width as that of the signal wirings 508 (while the power-supply and ground wirings are formed in a solid pattern in a region with a high density of wiring patterns in FIGS. 4A and 4B, they are not formed in a solid pattern in FIGS. 5A and 5B).

This configuration makes it possible to reduce the inductance of the power-supply and ground wirings, and to arrange the signal through vias 507 at positions close to the connection pads 504 in a region with a high wiring density. Since the signal through vias 507 can be arranged at positions close to the connection pads 504, the wiring lengths of the signal wirings can be reduced in the semiconductor device of a PoP structure. Further, the reduction of the wiring lengths of the signal wirings ensures stable operation at a speed of 1600 Mbps or more, for example at 2133 Mbps Referring to FIGS. 6A to 6F, an assembly flow of the semiconductor device 100 according to the exemplary first embodiment will be described. FIGS. 6A to 6F are cross-sectional views showing an assembly flow of the semiconductor device 100 according to the first embodiment. Like components or parts as those of FIG. 3 are denoted by the same reference numerals.

Firstly, a wiring board 101 as shown in FIG. 6A is prepared. Connection pads 107 are arranged on one surface of the wiring board 101, and lands 110 are arranged on the other surface of the wiring board 101.

Next, as shown in FIG. 6B, a first semiconductor chip 103 having an adhesive member 113 formed on the rear surface is mounted on the wiring board 101. Further, a second semiconductor chip 105 having an adhesive member formed on the rear surface is stacked on the first semiconductor chip 103.

Then, as shown in FIG. 6C, the electrode pads 104 of the first semiconductor chip 103 and the connection pads 107 of the wiring board 101 are electrically connected with wires 108.

Each of the wires 108 is formed of Au or the like, and the tip of the wire 108 is molten to form a ball, which is ultrasonic thermocompression-bonded onto the electrode pad 104 of the first semiconductor chip 103 by means of a wire bonding device (not shown). The wire 108 is then formed into a predetermined loop shape and the tail end of the wire 108 is ultrasonic thermocompression-bonded to the corresponding connection pad 107, whereby the wire connection is completed.

As show in FIG. 6D, a sealing resin (sealer) 109 is formed on one surface of the wiring board 101 by collective molding. The sealing resin 109 is formed, for example, by clamping the wiring board 101 with a molding unit composed of upper and lower molds of a transfer mold device (not shown), forcing a thermosetting epoxy resin from a gate into a cavity formed by the upper and lower molds, and thermosetting the epoxy resin in the cavity.

After that, as shown in FIG. 6E, an electrical conductive solder ball 102 is mounted on each of lands 110 on the other surface of the wiring board 101 to form an external terminal (bump electrode). In this ball mounting process, a suction mechanism (not shown) having a plurality of suction holes formed in accordance with the arrangement of the lands 110 on the wiring board 101 is used to hold the solder balls 102 in the suction holes and to transfer flux to the solder ball 102 thus held, whereby the solder balls 102 are collectively mounted on the lands 110 of the wiring board 101. The solder balls thus mounted are reflown to form external terminals.

The wiring board 101 on which the external terminal have been formed is cut and separated into pieces along dicing lines 600, as shown in FIG. 6F. The board dicing is performed by attaching the sealing resin 109 of the wiring board 101 to dicing tape (not shown) so that the wiring board 101 is supported by the dicing tape. The wiring board 101 is cut along the longitudinal and transverse dicing lines 600 with a dicing blade (not shown), so that the wiring board 101 is separated into pieces. After completing the separation, each of the separated pieces is picked up from the dicing tape to obtain the semiconductor device 100 as shown in FIG. 3.

Figure 7:
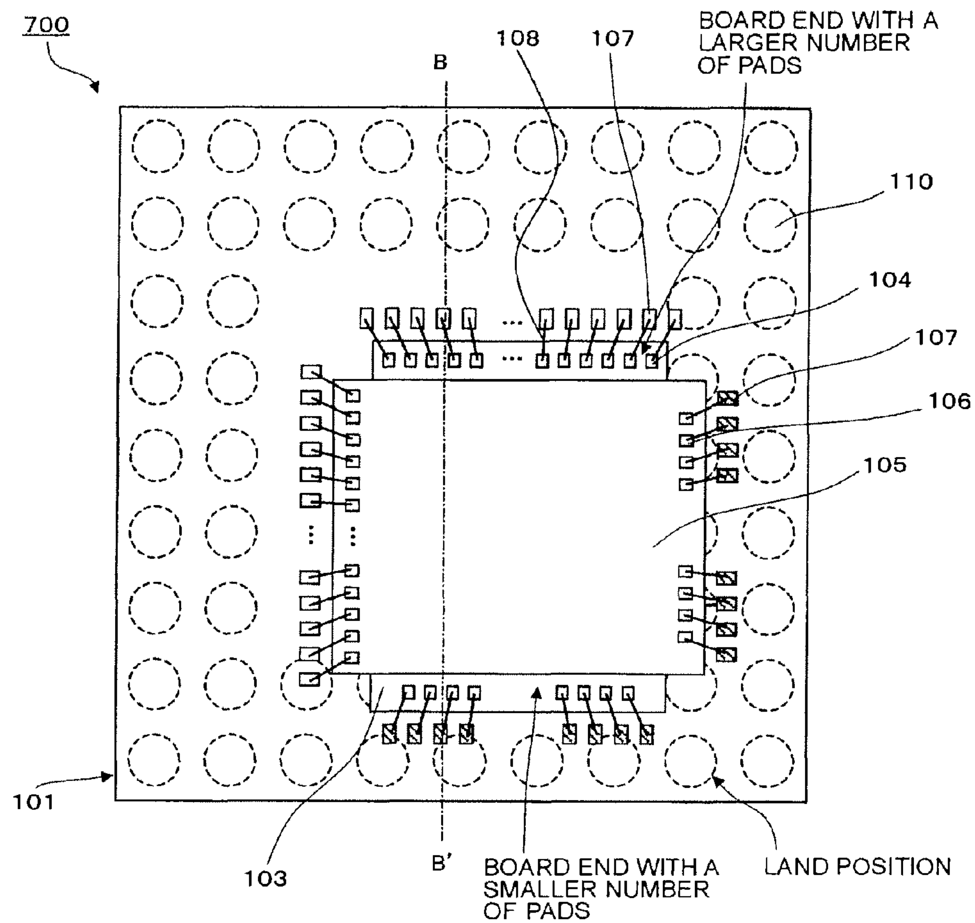
FIG. 7 is a plan view showing a schematic configuration of a semiconductor device according to a second embodiment of the invention.
Figure 8:
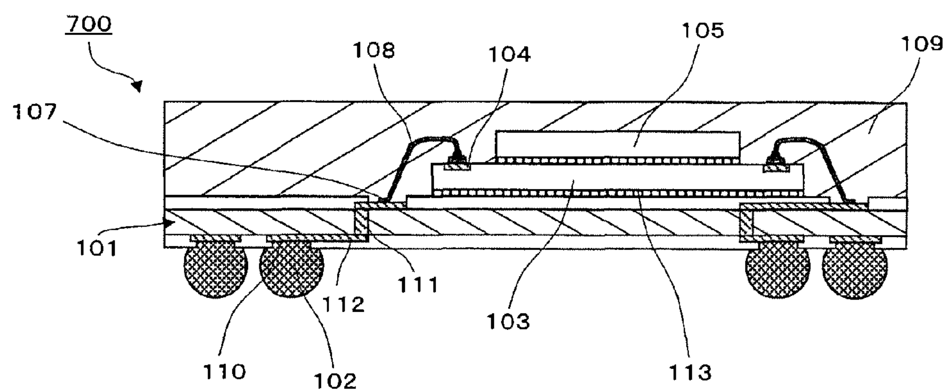
FIG. 8 is a cross-sectional view showing the schematic configuration of the semiconductor device according to the second embodiment of the invention.
Figure 9A:
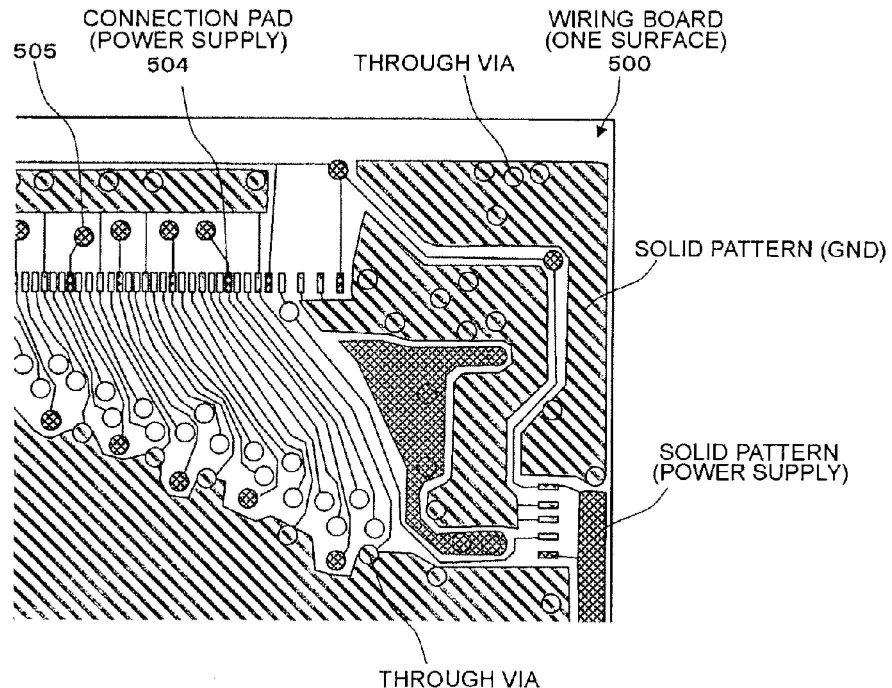
FIG. 9A is a plan view showing a schematic configuration of a wiring pattern of the semiconductor device according to the second embodiment of the invention.
Figure 9B:
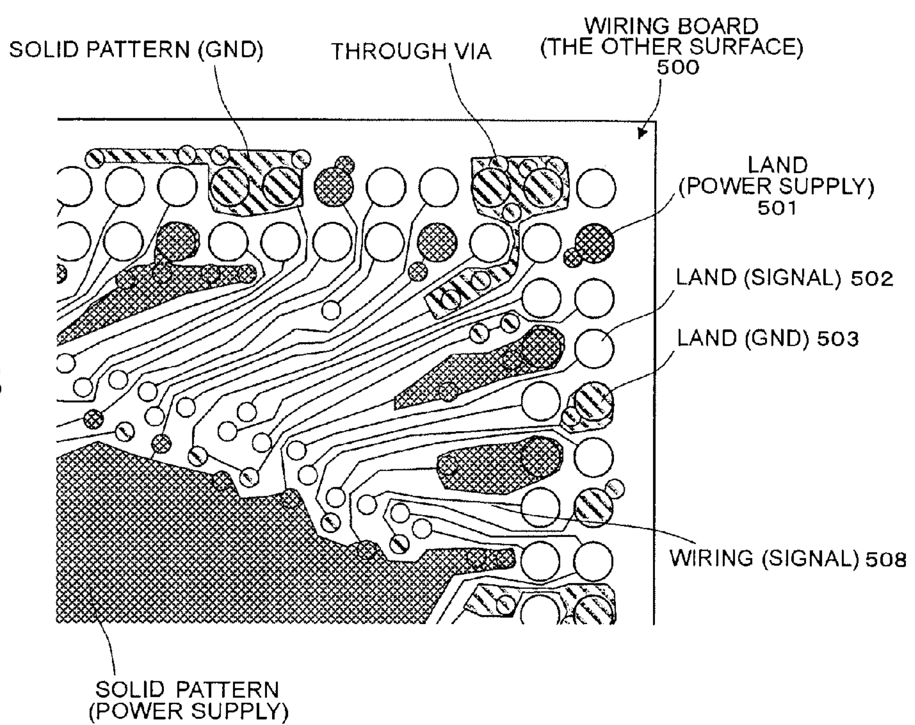
FIG. 9B is a plan view showing the schematic configuration of the wiring pattern of the semiconductor device according to the second embodiment of the invention.

Referring to FIGS. 7 and 8 and FIGS. 9A and 9B, a configuration of a semiconductor device according to an exemplary second embodiment of the invention will be described. FIG. 7 is a plan view and FIG. 8 is a cross-sectional view both showing a configuration of the semiconductor device according to the second embodiment. FIGS. 9A and 9B are plan views showing a wiring pattern of the semiconductor device according to the second embodiment.

While a semiconductor device 700 according to the second embodiment is configured in the same manner as the semiconductor device 100 according to the first embodiment, the semiconductor device 700 differs from the semiconductor device 100 according to the first embodiment in the arrangement of the first semiconductor chip 103 and the second semiconductor chip 105. It should be noted that the same components and parts as those shown in FIGS. 2 and 3 are denoted by the same reference numerals.

In the second embodiment, as shown in FIGS. 7 and 8, the first semiconductor chip 103 and the second semiconductor chip 105 are mounted on the wiring board 101 to be shifted toward the short sides thereof where a smaller number of electrodes pads 104 are arranged so as to ensure wider space on the short sides thereof where a greater number of electrode pads 104 are arranged.

The second embodiment provides the same advantageous effects as those of the first embodiment. In addition, according to second embodiment, the first semiconductor chip 103 and the second semiconductor chip 105 are shifted to the short sides where a smaller number of electrode pads 104 are arranged, whereby it is made possible to arrange signal through vias 111 between connection pads 107 and lands 110. Further, the wiring lengths of the signal wirings can be reduced.

Furthermore, as shown in FIGS. 9A and 9B, through vias 505 effective for reducing the inductance of the power-supply and ground can be arranged between the connection pads 504 and an end of the wiring board 500, which ensures a wider wiring area.

Figure 10:
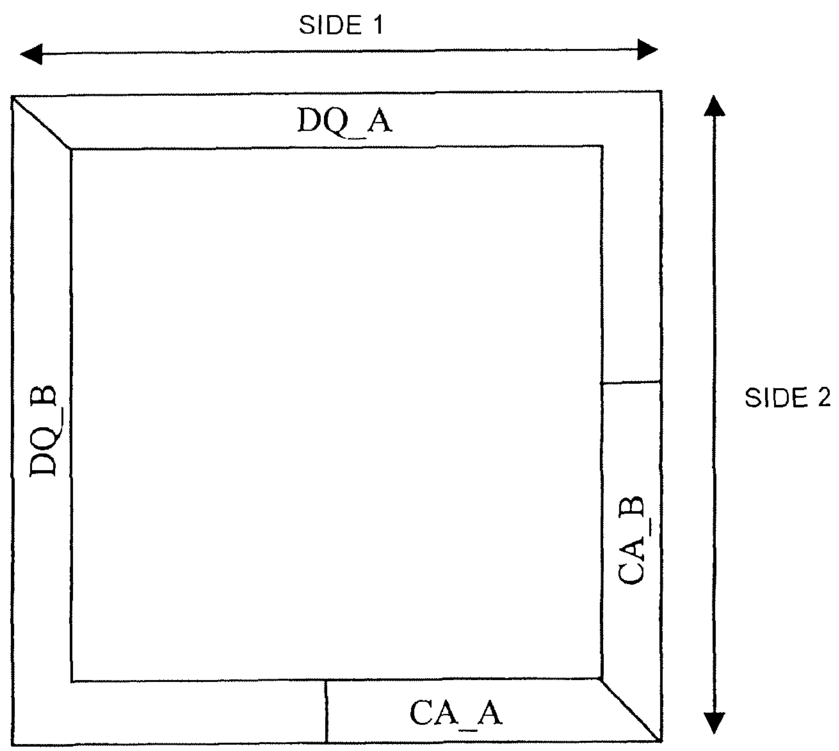
FIG. 10 is a plan view showing a configuration of a semiconductor device according to a third embodiment of the invention.
Figure 11A:
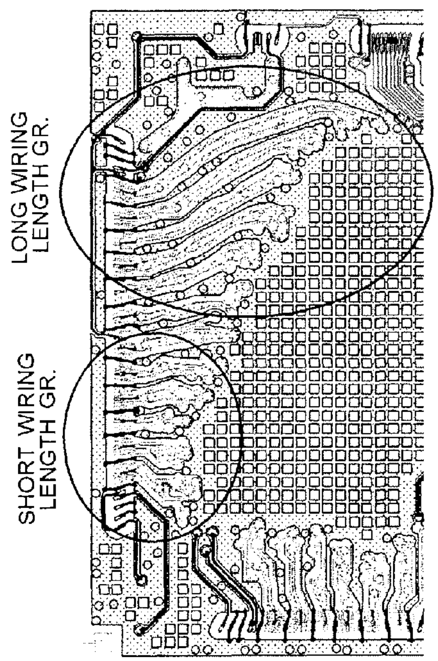
FIG. 11A is a plan view showing a configuration of a wiring pattern of the semiconductor device shown in FIG. 10.
Figure 11B:
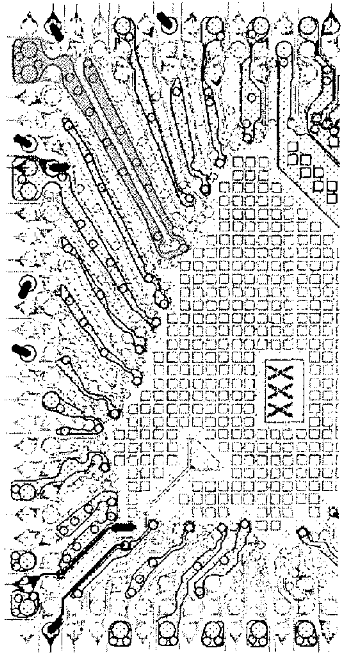
FIG. 11B is a plan view showing the configuration of the wiring pattern of the semiconductor device shown in FIG. 10.
Figure 11C:
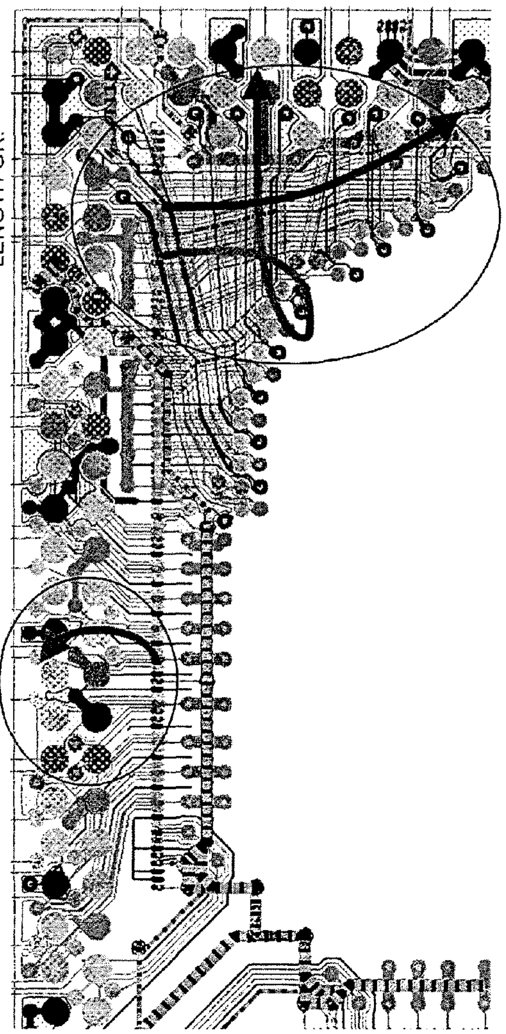
FIG. 11C is a plan view showing the configuration of the wiring pattern of the semiconductor device shown in FIG. 10.
Figure 12:
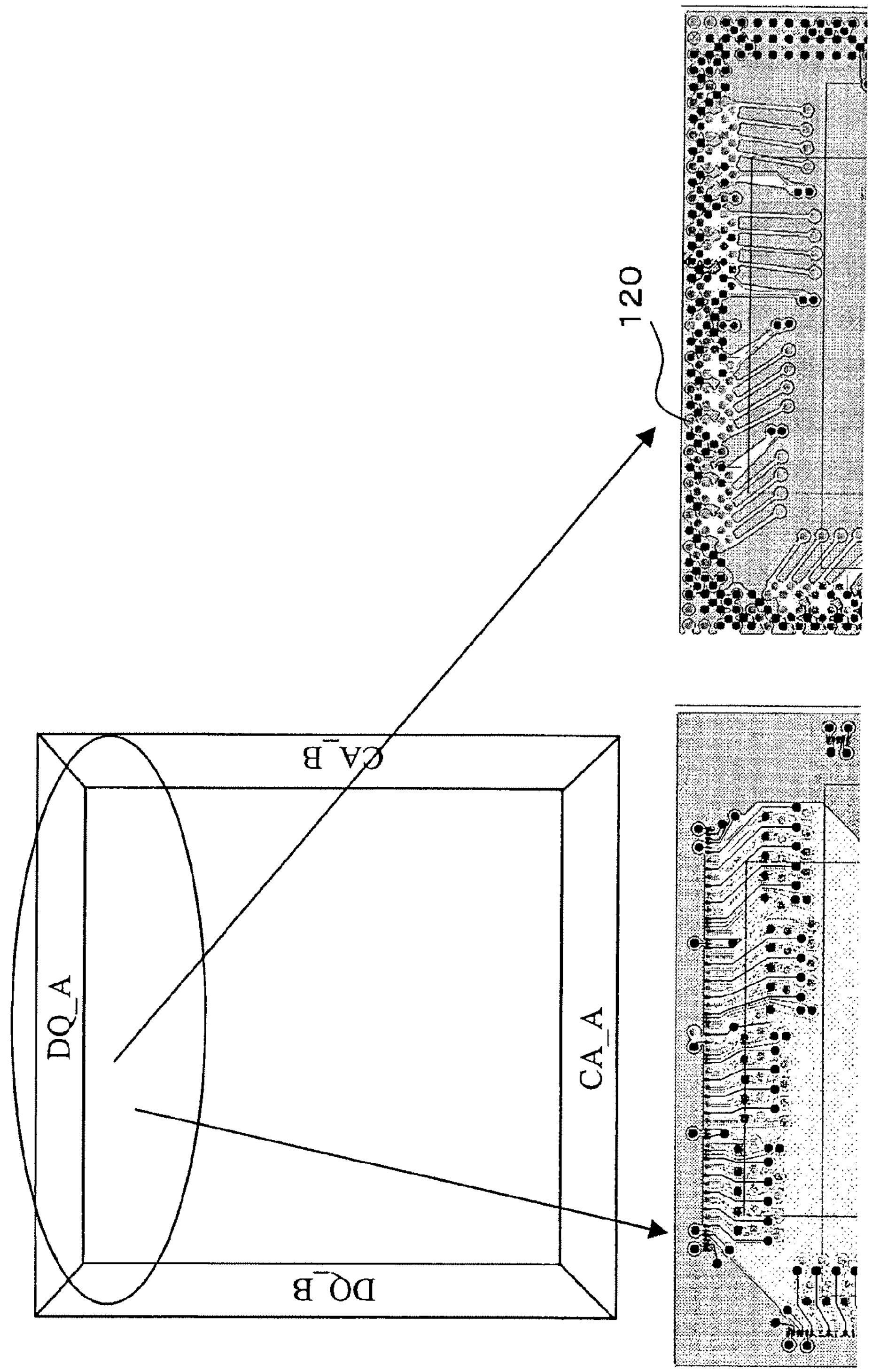
FIG. 12 is a plan view showing a configuration and a wiring pattern of the semiconductor device according to the third embodiment of the invention.

Next, referring to FIG. 10, FIGS. 11A, 11B and 11C, and FIG. 12, a configuration of a semiconductor device according to an exemplary third embodiment of the invention will be described. FIG. 10 is a plan view showing a schematic configuration of a semiconductor device according to the third embodiment. FIGS. 11A, 11B and 11C are plan views showing a schematic configuration of a wiring pattern of the semiconductor device shown in FIG. 10. FIG. 12 is a plan view showing a schematic configuration of a wiring pattern of the semiconductor device according to the third embodiment.

One of reasons why wiring lengths of some of the signal wirings are increased resides in arrangement of solder balls allocated thereto.

As shown in FIG. 10, for example, a signal relating to DQ_A may not be able to be allocated in one side (side 1) and may be allocated to extend to a different side (side 2). In this case, as shown in FIGS. 11A, 11B and 11C, a group of wirings with short wiring length (Gr) and a group of wirings with long wiring length (Gr) are produced, which poses a restriction to reduction of the wiring lengths of the signal wirings even if the configuration of the second embodiment is used.

According to the third embodiment as shown in FIG. 12, therefore, solder balls 120 are arranged at a reduced pitch, or the number of rows of the solder balls 120 arranged along each side is increased, so that the total number of solder balls arranged along each side is increased. This makes it possible to allocate all the signal groups in one side, and to reduce the wiring lengths of the signal wirings.

Next, referring to FIGS. 13A and 13B, a configuration of a semiconductor device according to an exemplary fourth embodiment of the invention will be described. FIG. 13A is a schematic diagram showing a comparative example, and FIG. 13B is a plan view showing a schematic configuration of a semiconductor device according to the fourth embodiment.

Figure 13B:
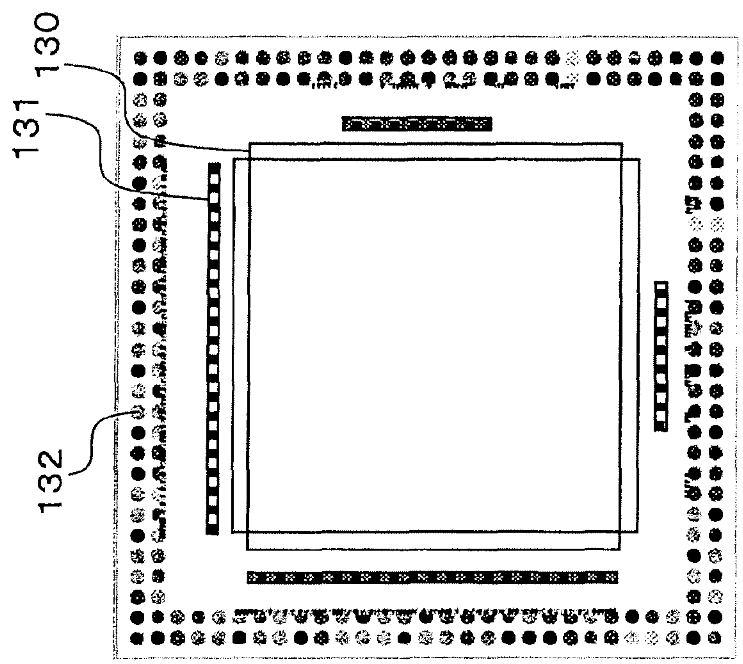
FIG. 13B is a plan view showing the configuration of the semiconductor device according to a fourth embodiment of the invention.
Figure 13A:
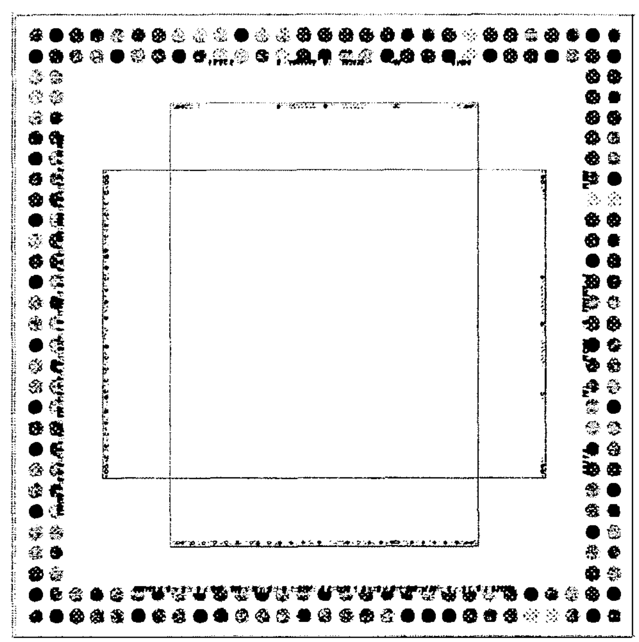
FIG. 13A is a plan view showing a configuration of a semiconductor device according to a fourth embodiment of the invention.
Figure 13A:
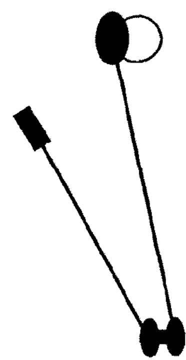

As shown in FIG. 13B, the aspect ratio of the shape of the semiconductor chip 130 is set to a value close to one, and connection pads 131 are positioned away from solder balls 132. This configuration makes it possible to ensure a sufficient wiring area and to route wirings from the connection pads 131 to the solder balls 132 without turning back.

Next, referring to FIG. 14, a schematic configuration of a semiconductor device according to a fifth embodiment of the invention will be described.

Due to various restrictions caused by increased die size (chip size), reduced package size, and the like, connection pads are required to be positioned close to the periphery of the package.

Figure 14:
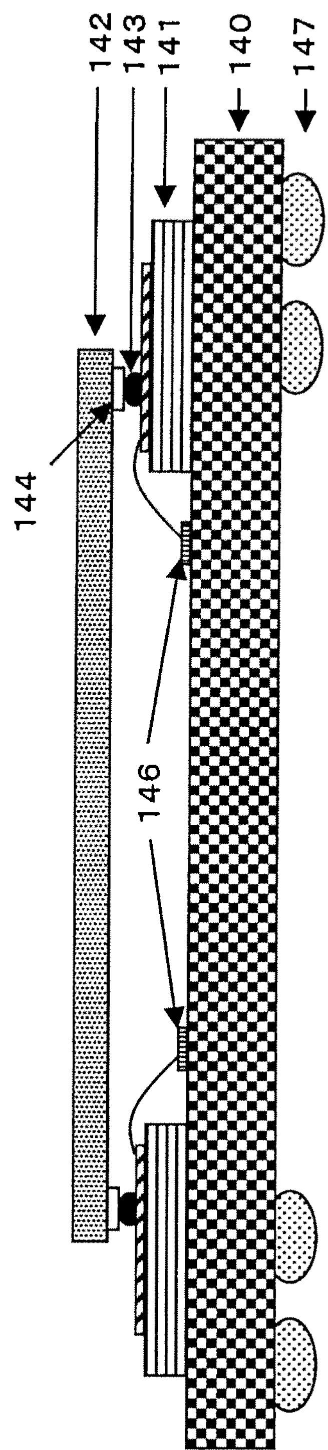
FIG. 14 is a cross-sectional view showing a configuration of a semiconductor device according to a fifth embodiment of the invention.

In this case, as shown in FIG. 14, a semiconductor chip (die) 142 is flip-chip mounted on a sub-printed board 141 placed on a package 140, by means of bumps 143 and an electrode pads 144, while bonding wires 145 are arranged on the inner side of the sub-printed board 141, so that connection pads 146 are positioned on the inner side.

This makes it possible to route the wirings from the connection pads 145 to solder balls 147 without turning back.

Although the invention made by this inventor has been described with reference to the exemplary embodiments, the invention is not limited to the foregoing embodiments but may be modified in various manners without departing from the scope of the invention.

Although in the foregoing embodiments, the description has been made of a case where the invention is applied to a MCP (Multi Chip Package) in which two semiconductor chips are mounted in stack, the invention is also applicable to a BGA (Ball Grid Array) or a LGA (Land Grid Array) in which a single semiconductor chip is mounted. Further, the invention is also applicable to a MCP having three or more chips.

Further, although in the foregoing embodiments, the description has been made of a case where a glass-epoxy wiring board is used, the invention is also applicable to a flexible wiring board made of polyimide or the like, as long as the wiring board has external terminals arranged only on the periphery and has a region where wiring patterns are arranged densely.

What is claimed is:

1. A semiconductor device comprising:

an insulating substrate including a first surface and a second surface opposite to the first surface;

a semiconductor chip including a plurality of first electrodes thereon, the semiconductor chip being mounted over the first surface of the insulating substrate, the plurality of first electrodes including signal electrodes, power-supply electrodes and ground electrodes;

a plurality of connection pads provided on the first surface of the insulating substrate, the plurality of connection pads including signal connection pads electrically connected to the signal electrodes, power-supply connection pads electrically connected to the power-supply electrodes and ground connection pads electrically connected to the ground electrodes;

a plurality of lands provided on the second surface of the insulating substrate, the plurality of lands including signal lands, power-supply lands and ground lands;

a plurality of through vias penetrated from the first surface to the second surface of the insulating substrate, the plurality of through vias including signal vias electrically connecting the signal connection pads to the signal lands, power-supply vias electrically connecting the power-supply connection pads to the power-supply lands and ground vias electrically connecting the ground connection pads to the ground lands, wherein density of the signal vias is arranged higher than density of the power-supply vias and ground vias in a region of the insulating substrate; and a plurality of first wirings provided on the first surface on the insulating substrate to electrically connect the plurality of connection pads to the plurality of through vias, the plurality of first wirings including signal first wirings electrically connecting the signal connection pads to the signal vias, power-supply first wirings electrically connecting the power-supply connection pads to the power-supply through vias and ground first wirings electrically connecting the ground connection pads to the ground through vias.

2. The semiconductor device according to claim 1, wherein said region of the insulating substrate has a high signal first wiring density.

3. The semiconductor device according to claim 1, wherein said region of the insulating substrate is close to the plurality of connection pads.

4. The semiconductor device according to claim 1, wherein the of first electrodes are arranged along a first side of the semiconductor chip, and wherein the first side of the first semiconductor chip faces toward and is substantially in parallel with the plurality of connection pads.

5. The semiconductor device according to claim 4, wherein the semiconductor chip includes a plurality of second electrodes arranged along a second side of the semiconductor chip, and wherein a number of the plurality of first electrodes is larger than that of the plurality of second electrodes.

6. The semiconductor device according to claim 1, wherein the power-supply first wirings and the ground first wirings are substantially equal in width to the signal first wirings.

7. The semiconductor device according to claim 1, further comprising:

a plurality of second wirings provided on the second surface of the insulating layer to electrically connect the plurality of through vias to the plurality of lands, the plurality of second wirings including signal second wirings electrically connecting the signal vias to the signal lands, power-supply second wirings electrically connecting the power-supply vias to the power-supply lands, and ground second wirings electrically connecting the power-supply vias to the ground lands, wherein one or more of the signal vias are arranged closer to a corresponding one or more signal lands than one or more of the power-supply vias or ground vias are arranged to a corresponding one or more power-supply lands or ground lands.

8. The semiconductor device according to claim 1, further comprising:

a plurality of solder balls provided on the plurality of first lands;

a second insulating substrate provided over the second surface of the insulating substrate, the second insulating substrate including a plurality of second lands thereon, the plurality of second lands being electrically connected to the plurality of solder balls; and a second semiconductor chip mounted over the second insulating substrate, wherein the plurality of solder balls are arranged so as to avoid the second semiconductor chip.

9. The semiconductor device according to claim 8, wherein the semiconductor chip is a memory chip, and the second semiconductor chip is a controller chip.

10. A semiconductor device comprising:

a wiring board including a first surface, and a second surface opposite to the first surface;

a semiconductor chip including a plurality of first electrodes thereon, the semiconductor chip being mounted over the first surface of the wiring board, the plurality of first electrodes including signal electrodes, power-supply electrodes and ground electrodes;

a plurality of connection pads provided on the first surface of the wiring board, the plurality of connection pads including signal connection pads electrically connected to the signal electrodes, power-supply connection pads electrically connected to the power-supply electrodes and ground connection pads electrically connected to the ground electrodes;

a plurality of lands provided on the second surface of the wiring board, the plurality of lands including signal lands, power-supply lands and ground lands;

a plurality of through vias penetrated from the first surface to the second surface of the wiring board, the plurality of through vias including signal vias electrically connecting the signal connection pads to the signal lands, power-supply vias electrically connecting the power-supply connection pads to the power-supply lands and ground vias electrically connected connecting the ground connection pads to the ground lands; a plurality of first wirings provided on the first surface on the wiring board to electrically connect the plurality of connection pads to the plurality of through vias, the plurality of first wirings including signal first wiring electrically connecting the signal connection pads to the signal vias, power-supply first wirings electrically connecting the power-supply connection pads to the power-supply through vias and ground first wirings electrically connecting the ground connection pads to the ground through vias and a plurality of second wirings provided on the second surface of the wiring board to electrically connect the plurality of through vias to the plurality of lands, the plurality of second wirings including signal second wirings electrically connecting the signal vias to the signal lands, power-supply second wirings electrically connecting the power-supply vias to the power-supply lands, and ground second wirings electrically connecting the power-supply vias to the ground lands, wherein one or more of the signal vias are arranged closer to a corresponding one or more signal lands than one or more of the power-supply vias or ground vias are arranged to a corresponding one or more power-supply lands or ground lands.

11. The semiconductor device according to claim 10, wherein density of the signal vias is arranged higher than density of the power-supply vias and ground vias in a region having a high signal first wiring density.

12. The semiconductor device according to claim 11, wherein said region is close to the plurality of connection pads on the first surface of the wiring board.

13. The semiconductor device according to claim 10, wherein the first electrodes are arranged along a first side of the semiconductor chip, and wherein the first side of the first semiconductor chip faces toward and is substantially in parallel with the plurality of connection pads.

14. The semiconductor device according to claim 13, wherein the semiconductor chip includes a plurality of second electrodes provided along a second side of the semiconductor chip, and wherein a number of the plurality of first electrodes is larger than that of the plurality of second electrodes.

15. The semiconductor device according to claim 10, wherein the power-supply first wirings and the ground first wirings are substantially equal in width to the signal first wirings.

16. The semiconductor device according to claim 10, further comprising:

a plurality of bonding wires electrically connecting one or more of the plurality of first electrodes on the semiconductor chip to a corresponding one or more of the plurality of connection pads on the first surface of the wiring board.

17. The semiconductor device according to claim 10, further comprising:

a plurality of solder balls provided on the plurality of first lands;

a second wiring board provided over the second surface of the wiring hoard, the second wiring board including a plurality of second lands thereon, the plurality of second lands being electrically connected to the plurality of solder balls; and a second semiconductor chip mounted over the second wiring board, wherein the plurality of solder balls are arranged so as to avoid the second semiconductor chip.

18. The semiconductor device according to claim 17, wherein the first semiconductor chip is a memory chip, and the second semiconductor chip is a controller chip.

* * * * *